(12) United States Patent
Takahashi et al.

(10) Patent No.: US 10,367,113 B2
(45) Date of Patent: Jul. 30, 2019

(54) PHOTOELECTRIC CONVERSION DEVICE, IMAGING ELEMENT, AND IMAGING DEVICE

(71) Applicant: CANON KABUSHIKI KAISHA, Tokyo (JP)

(72) Inventors: Tetsuo Takahashi, Kawasaki (JP); Hidekazu Takahashi, Zama (JP); Naoki Yamada, Inagi (JP); Yojiro Matsuda, Kawasaki (JP); Masumi Itabashi, Yamato (JP); Hirokazu Miyashita, Tokyo (JP); Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/647,007

(22) Filed: Jul. 11, 2017

(65) Prior Publication Data

US 2018/0019363 A1  Jan. 18, 2018

(30) Foreign Application Priority Data

Jul. 15, 2016 (JP) .................................. 2016-140643
Jul. 15, 2016 (JP) .................................. 2016-140644
Jun. 2, 2017 (JP) .................................. 2017-110322

(51) Int. Cl.
*H01L 31/153* (2006.01)
*H01L 31/0216* (2014.01)
(Continued)

(52) U.S. Cl.
CPC ...... *H01L 31/153* (2013.01); *H01L 31/02164* (2013.01); *H01L 31/02327* (2013.01);
(Continued)

(58) Field of Classification Search
CPC .............. H01L 31/153; H01L 33/38; H01L 31/022408; H01L 31/02327; H01L 31/02164; H01L 31/102
See application file for complete search history.

(56) References Cited

U.S. PATENT DOCUMENTS 6,121,620 A * 9/2000 Tashiro ............. H01L 27/14692
250/370.11
7,619,267 B2 * 11/2009 Araki ................ H01L 27/14603
257/233
(Continued)

FOREIGN PATENT DOCUMENTS

JP  2013-254840 A  12/2013

OTHER PUBLICATIONS

Daisuke Yokoyama et al.; "Horizontal orientation of linear-shaped organic molecules having bulky substituents in neat and doped vacuum-deposited amorphous films;" Organic Electronics ; vol. 10, 2009; pp. 127-137.
(Continued)

*Primary Examiner* — Syed I Gheyas
(74) *Attorney, Agent, or Firm* — Canon U.S.A., Inc. IP Division

(57) ABSTRACT

A device uses a light-emitting material. The device includes an upper and a lower electrode, a first photoelectric conversion portion disposed between the upper electrode and the lower electrode, a second photoelectric conversion portion, a first readout circuit connected to the first photoelectric conversion portion, and a second readout circuit connected to the second photoelectric conversion portion. The second photoelectric conversion portion converts light emitted from the light-emitting material into electrical charges.

18 Claims, 7 Drawing Sheets

(51) Int. Cl.
*H01L 31/0232* (2014.01)
*H01L 31/102* (2006.01)
*H01L 31/0224* (2006.01)
*H01L 33/38* (2010.01)

(52) U.S. Cl.
CPC .... *H01L 31/022408* (2013.01); *H01L 31/102* (2013.01); *H01L 33/38* (2013.01)

(56) References Cited

U.S. PATENT DOCUMENTS

| 2008/0043129 A1* | 2/2008 | Li | H01L 27/14621 |
| | | | 348/308 |
| 2015/0349011 A1* | 12/2015 | Kato | H01L 27/14625 |
| | | | 250/201.4 |

OTHER PUBLICATIONS

Jörg Frischeisen et al.; "Determination of molecular dipole orientation in doped fluorescent organic thin films by photoluminescence measurements;" Applied Physics Letters, vol. 96, 2010, pp. 073302-1 through 073302-3.

* cited by examiner

PHOTOELECTRIC CONVERSION DEVICE, IMAGING ELEMENT, AND IMAGING DEVICE

BACKGROUND

Field of the Disclosure

The present disclosure relates to a photoelectric conversion device, an imaging element, and an imaging device.

Description of the Related Art

Photoelectric conversion devices are configured to convert incoming light into electrical charges and are widely used in cameras and other imaging devices. A multilayer photoelectric conversion device intended for use over a wide dynamic range is used in image sensors of cameras.

Japanese Patent Laid-Open No. 2013-254840 (hereinafter PTL 1) discloses a photoelectric conversion device including two photoelectric conversion elements. One of the photoelectric conversion elements is disposed above a semiconductor substrate, and the other is disposed within the semiconductor substrate. The photoelectric conversion element within the semiconductor substrate receives a part of light transmitted through the photoelectric conversion element on the semiconductor substrate. According to this patent document, images are formed by using signals of the photoelectric conversion element above the semiconductor substrate when the quantity of incoming light is small; and images are formed by using signals of the photoelectric conversion element within the semiconductor substrate when the quantity of incoming light is large. In other words, the photoelectric conversion device disclosed in PTL 1 uses the photoelectric conversion element within the semiconductor substrate as the second photoelectric conversion element.

In this photoelectric conversion device disclosed in PTL 1, the light incident on the photoelectric conversion element within the substrate has passed through the photoelectric conversion element on the substrate. Therefore, the light is significantly affected by the thickness of the photoelectric conversion element above the substrate. Consequently, the thickness of the photoelectric conversion element above the substrate causes the signals of the photoelectric conversion device to have an error.

SUMMARY OF THE EMBODIMENT

According to an aspect of the present disclosure, there is provided a device containing a light-emitting material. The device includes an upper and a lower electrode, a first photoelectric conversion portion disposed between the upper electrode and the lower electrode, a second photoelectric conversion portion, a first readout circuit connected to the first photoelectric conversion portion, and a second readout circuit connected to the second photoelectric conversion portion. The second photoelectric conversion portion converts light emitted from the light-emitting material into electrical charges.

Further features of the present disclosure will become apparent from the following description of exemplary embodiments with reference to the attached drawings.

DESCRIPTION OF THE EMBODIMENTS

The photoelectric conversion device disclosed herein contains a light-emitting material and includes a second photoelectric conversion portion capable of converting light emitted from the light-emitting material into electrical charges. Consequently, the maximum luminance of light that the photoelectric conversion device can convert is high.

The light-emitting material absorbs light received by the photoelectric conversion device and emits photoluminescent light. Even if light with a luminance sufficient to saturate the signal of the first photoelectric conversion portion enters the photoelectric conversion device, the light-emitting material absorbs the incoming light to reduce the luminance so that the second photoelectric conversion portion can absorb the light. Thus, the luminance that saturates the signal of the photoelectric conversion device can be increased. Also, by appropriately selecting the light-emitting material, light having a wide range of wavelengths can be converted into electrical charges.

Exemplary embodiments of the disclosure will now be described with reference to the drawings.

First Embodiment

A first embodiment will now be described with reference to FIGS. 1 and 2.

Figure 1:
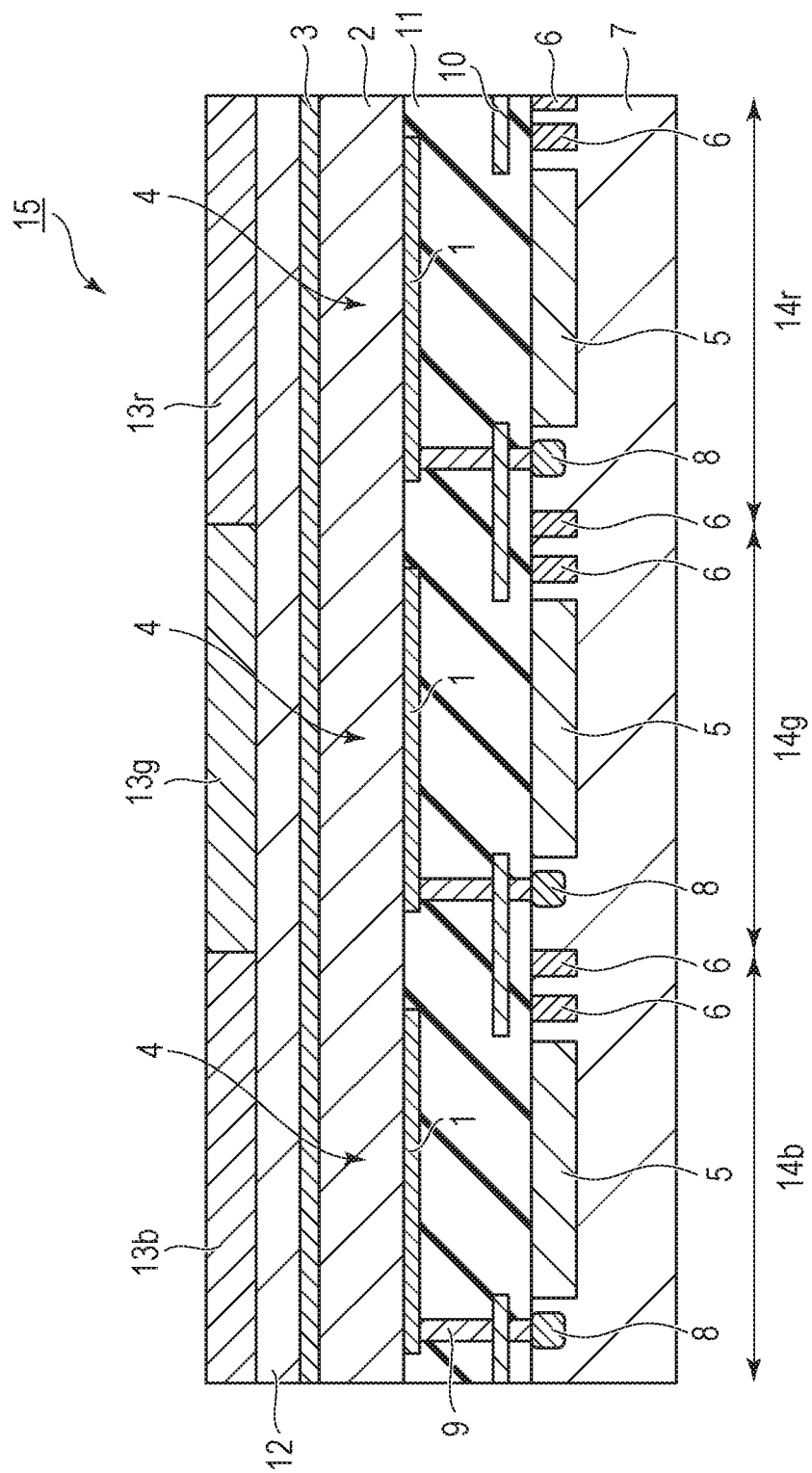
FIG. 1 is a schematic sectional view of a photoelectric conversion device according to an embodiment of the present disclosure.

FIG. 1 is a schematic sectional view of a photoelectric conversion device according to the first embodiment of the present disclosure. The photoelectric conversion device 15 includes photoelectric conversion elements 14 for different colors. More specifically, the photoelectric conversion device includes a photoelectric conversion element 14b for blue color, a photoelectric conversion element 14g for green color, and a photoelectric conversion element 14r for red color. These photoelectric conversion elements 14b, 14g, and 14r include color filters 13b, 13g, and 13r, respectively.

Each photoelectric conversion element 14 includes a first photoelectric conversion portion 4 including a lower electrode 1, a semiconductor layer 2, and an upper electrode 3. Furthermore, a second photoelectric conversion portion 5 is disposed closer than the first photoelectric conversion portion 4 to a substrate 7. The second photoelectric conversion portion 5 may be disposed closer than the first photoelectric conversion portion 4 to the light-incident side of the photoelectric conversion device. The first photoelectric conversion portion 4 may contain a light-emitting material. The light-emitting material may be present anywhere as long as light emitted therefrom can reach the second photoelectric conversion portion 5.

Although the first photoelectric conversion portion 4 and the second photoelectric conversion portion 5 may be made of any material without particular limitation, it is beneficial that the first photoelectric conversion portion 4 contain an organic compound, and that the second photoelectric conversion portion 5 contain an inorganic compound. The inorganic compound may be silicon or an oxide semiconductor, such as InGaZnO.

The lower electrode is connected to a plug 9. The plug is connected to an impurity diffusion region 8. A light-blocking layer 10 may be disposed closer than the impurity diffusion region 8 to the light-incident side. The light-blocking layer is made of tungsten or the like and is in such a shape that openings are formed over the second photoelectric conversion portions 5. Thus, readout circuits 6 and the impurity diffusion region 8 are shielded from light.

The impurity diffusion region 8 is a region of the semiconductor substrate 7 doped with an impurity. Any semiconductor material may be used as the semiconductor substrate 7 as long as an impurity can be implanted. For example, silicon or an oxide semiconductor, such as InGaZnO, may be used.

An intervening insulating layer may be provided between each of the lower electrodes 1 so that the lower electrodes are not electrically connected to each other.

In one embodiment, the first photoelectric conversion portion 4 is disposed closer than the semiconductor substrate 7 to the light-incident side, and the second photoelectric conversion portion is disposed within the semiconductor substrate 7. Thus, the interior of the semiconductor substrate and the region over the semiconductor substrate can be efficiently used. This is beneficial in terms of resolution.

A protective layer 12 or a planarizing layer (not shown) may be disposed closer than the upper electrode to the light-incident side. The protective layer 12 protects the photoelectric conversion elements 14. The planarizing layer is formed so as not to interfere with the formation of the color filters. These layers are not necessarily provided, depending on the structure.

The photoelectric conversion elements 14 are each connected to the readout circuits 6. Each read out circuit 6 reads the stored charge and output a charge signal to a signal processing circuit.

Beneficially, the upper and the lower electrode are made of a transparent electroconductive material, such as indium tin oxide (ITO) or an electroconductive material mainly containing polyimide.

The semiconductor layer 2 includes a photoelectric conversion layer. The photoelectric conversion layer absorbs incoming light and generates a charge corresponding to the quantity of absorbed light. The semiconductor layer 2 may further include a charge transport layer capable of transporting electrical charges, a charge blocking layer capable of preventing electrical charges from entering from the electrodes, or any other functional layer, between the electrodes and the photoelectric conversion layer.

The photoelectric conversion layer may be made of an inorganic, an organic, or an organic-inorganic hybrid material that can convert light into electrical charges. If the photoelectric conversion layer is made of an inorganic material, the photoelectric conversion layer may be defined by an amorphous silicon layer, an amorphous selenium layer, a quantum dot layer, a compound semiconductor layer, or the like. If the photoelectric conversion layer is made of an organic material, the organic material may be selected from dyes, such as metal complex dyes and cyanine dyes. Other organic material may be used, such as derivatives of acridine, coumarin, triphenylmethane, fullerene, aluminum quinoline, indane, benzoindane, dicyano compounds, poly (para-phenylene), polyfluorene, polyvinylcarbazole, polythiol, polypyrrole, and polythiophene.

In the case of a quantum dot layer, the photoelectric conversion layer may contain a buffer material, such as AlGaAs or GaAs, and quantum dots of InAs or InGaAs. If the photoelectric conversion layer contains an organic-inorganic hybrid material, an organic-inorganic hybrid perovskite film may be used. The material forming an organic-inorganic hybrid perovskite film may be represented by a general formula $ABX_3$. In this formula, A and B each represent a cationic material, and X represents an anionic material. In the organic-inorganic hybrid material used herein, any of A, B, and X is an organic material. For example, a well-known material $CH_3NH_3PbI_3$, in which A=$CH_3NH_3$, B=Pb, and X=I, may be used.

The light-emitting material may be contained in a light-emitting member. The light-emitting material may be a low-molecular-weight or macromolecular organic compound. Beneficially, the light-emitting material is such that the transition moments thereof can be aligned in a specific direction. Examples of such a compound include bis[2-(2-pyridinyl-N)phenyl-C] (acetylacetonato) iridium (III), which may be represented as Ir(ppy)2(acac), and tetraphenyldibenzoperiflanthene.

For aligning the transition moments in a specific direction, any method may be used. For example, the conditions for deposition may be controlled. If a macromolecular compound is used as the light-emitting material, the direction in which the light-emitting material is applied is controlled, or the substrate having the coating of the light-emitting material may be stretched. For checking whether or not molecules are aligned in a specific direction, the emission pattern or the polarization of photoluminescent light (PL light) may be measured.

For checking whether a majority of the transition moments of the light-emitting material are oriented in a specific direction, for example, variable angle photoluminescence measurement or variable angle spectroscopic ellipsometry may be used.

If the light-emitting member is defined by a thin film made of only a light-emitting material, variable angle spectroscopic ellipsometry may be employed. More specifically, a sample prepared by forming a thin film having the same composition as the light-emitting material to a thickness of 10 nm to 100 nm on a silicon substrate is subjected to variable angle spectroscopic ellipsometry to obtain ellipsometry parameters. From the obtained data, orientation order parameter S is calculated by data analysis. If the resulting orientation order parameter S satisfies $-0.50 \leq S < 0$, it can be assumed that a majority of the transition moments of the light-emitting material are parallel to the surface of the substrate. In one embodiment, $-0.50 \leq S < -0.15$, or $-0.50 \leq S < -0.3$, holds true. The orientation order parameter S mentioned herein is expressed by the following equation (1): $S=(1/2)<3 \cos 2 \theta - 1> = (Ke-Ko)/(Ke+2Ko)$. In this equation, $\theta$ represents the angle between the molecular axis of the compound in a thin film (of 10 nm to 100 nm in thickness) formed on a substrate and the normal of the substrate. Ko and Ke represent the extinction coefficients of the thin film in the directions parallel to and perpendicular to the substrate respectively, measured by variable angle spectroscopic ellipsometry. If all the molecules in the thin film are aligned in the direction parallel to the substrate, the order parameter S is −0.50. If the molecules orient at random without being aligned, S is 0.00.

For variable angle spectroscopic ellipsometry, for example, a variable angle spectroscopic ellipsometer manufactured by J. A. Woollam may be used, and measured data may be analyzed by using an analysis software program WVASE 32 produced by J. A. Woollam. A method for determining the orientation of molecules in a thin film by variable angle spectroscopic ellipsometry is disclosed in Organic Electronics 10, 127-137.

If the transition moments of the light emitting material are not accurately measured by variable angle spectroscopic ellipsometry, for example, as in the case where the light-emitting member contains another material in addition to the light-emitting material, variable-angle photoluminescence measurement can be employed. More specifically, a sample prepared by forming a thin film having the same composition as the light-emitting material on a quartz substrate is subjected to photoluminescence variable-angle measurement, and the measurements are analyzed by optical simulation. When the proportion of the transition moments of the light-emitting material parallel to the surface of the substrate is higher than that of the transition moments orienting at random, it can be assumed that a majority of the transition moments of the light-emitting material are parallel to the surface of the substrate. A method for determining the orientation of the molecules in a thin film by variable angle photoluminescence measurement is disclosed in Applied Physics Letters, 96, 073302.

The diffusion of PL light to other pixels may be relatively reduced by controlling the thicknesses of the components or layers of the first photoelectric conversion portion 4 to optimize optical interference so that PL light rays emitted from the light-emitting member constructively interfere toward the second photoelectric conversion portion.

In the photoelectric conversion element of the present embodiment, it is beneficial that first photoelectric conversion portion 4 be disposed closer than the second photoelectric conversion portion 5 to the light-incident side. Also, the light-emitting material may be present between the first photoelectric conversion portion and the second photoelectric conversion portion.

Alternatively, the first photoelectric conversion portion 4 may contain the light-emitting material. The light-emitting material is excited by incident light to emit photoluminescent light (hereinafter referred to as PL light). Since it is excited by incident light, the quantity of PL light emission has a correlation with the quantity of incident light.

If the first photoelectric conversion portion contains the light-emitting material, it is beneficial that the light-emitting material be present close to the lower electrode, that is, on the side toward the second photoelectric conversion portion. In the case where the first photoelectric conversion portion contains the light-emitting material, it may be said that the first photoelectric conversion portion doubles as the light-emitting member.

In the case where the light-emitting material is contained in the photoelectric conversion layer, the photoelectric conversion layer absorbs incoming light to generate excitons and converts the excitons not only into electrical charges, but also into PL light.

In addition, the relationship between the rate at which excitons are divided into charges and the radiation speed at which PL light is emitted can be controlled by appropriately selecting the material, and the proportion between a first photoelectric conversion layer and a second photoelectric conversion layer can be adjusted.

In the photoelectric conversion layer doubling as the light-emitting member, the photoelectric conversion material involved in photoelectric conversion may doubles as the light-emitting material to emit PL light, or a light-emitting material may be added to the photoelectric conversion material.

The light-emitting material capable of emitting PL light can be selected from among organic materials, inorganic materials, organic-inorganic hybrid materials. Many organic compounds allow PL light emission properties to be easily controlled by molecular design and are beneficial as the light-emitting material.

Examples of such an organic material include condensed ring compounds (such as fluorene derivatives, naphthalene derivatives, pyrene derivatives, perylene derivatives, tetracene derivatives, anthracene derivatives, and rubrene), quinacridone derivatives, coumarin derivatives, stilbene derivatives, phthalocyanine derivatives, organic aluminum complexes (such as tris(8-quinolinolato) aluminum), iridium complexes, platinum complexes, rhenium complexes, copper complexes, europium complexes, ruthenium complexes, and polymer derivatives (such as poly(phenylene vinylene) derivatives, polyfluorene derivatives, and polyphenylene derivatives). The inorganic light-emitting material may be selected from among quantum dots, inorganic fluorescent materials, and semiconductors.

The second photoelectric conversion portion converts light emitted from the light-emitting material into electrical charges. For converting light emitted from the light-emitting material into electrical charges in the second photoelectric conversion portion, in one embodiment, the second photoelectric conversion portion more efficiently converts light emitted from the light-emitting material into electrical charges than the first photoelectric conversion portion. In other words, the second photoelectric conversion portion converts PL light emitted from the light-emitting material into electrical chargers with a high efficiency.

The second photoelectric conversion portion may have a high photoelectric conversion sensitivity to light in a PL light wavelength region.

The PL light wavelength region refers to the range of wavelengths at which PL light intensity is 10% or more relative to the maximum PL light intensity in a PL spectrum. The PL spectrum can be obtained by measuring a thin film having the same composition as the light-emitting member, formed on a glass substrate with a photoluminescence measuring apparatus. The photoluminescence measuring apparatus may be, for example, Fluorophotometer F4500 manufactured by Hitachi.

Photoelectric conversion sensitivity is an indicator of signal voltage per quantity of incident light, obtained from the photoelectric conversion portion, and is represented in V/lx/s. For example, a phrase "a sensor has a photoelectric conversion sensitivity to a specific wavelength" or similar phrases mean that the sensor is sensitive to light having the specific wavelength sufficiently to measure the quantity of the light.

In the photoelectric conversion device capable of detecting visible light, it is beneficial that the photoelectric conversion layer and the light-emitting member absorb light in the entire visible region. Beneficially, the range of wavelengths of PL light emitted from the light-emitting member includes the near-infrared region. The PL light passes through the lower electrode and the intervening insulating layer and reaches the second photoelectric conversion portion. If the second photoelectric conversion portion is defined by a silicon photodiode, the second photoelectric conversion portion has a photoelectric conversion sensitivity to light in the near-infrared region. The near-infrared region is a range of wavelengths from 750 nm to 1400 nm.

The photoelectric conversion device produces two types of signals: one is obtained from the first photoelectric conversion portion capable of detecting incoming light; and the other is obtained from the second photoelectric conversion portion capable of detecting PL light emitted from the light-emitting material by excitation of the light-emitting material with incoming light. By combining the two types of signals, the dynamic range of the photoelectric conversion device can be extended.

Figure 2:
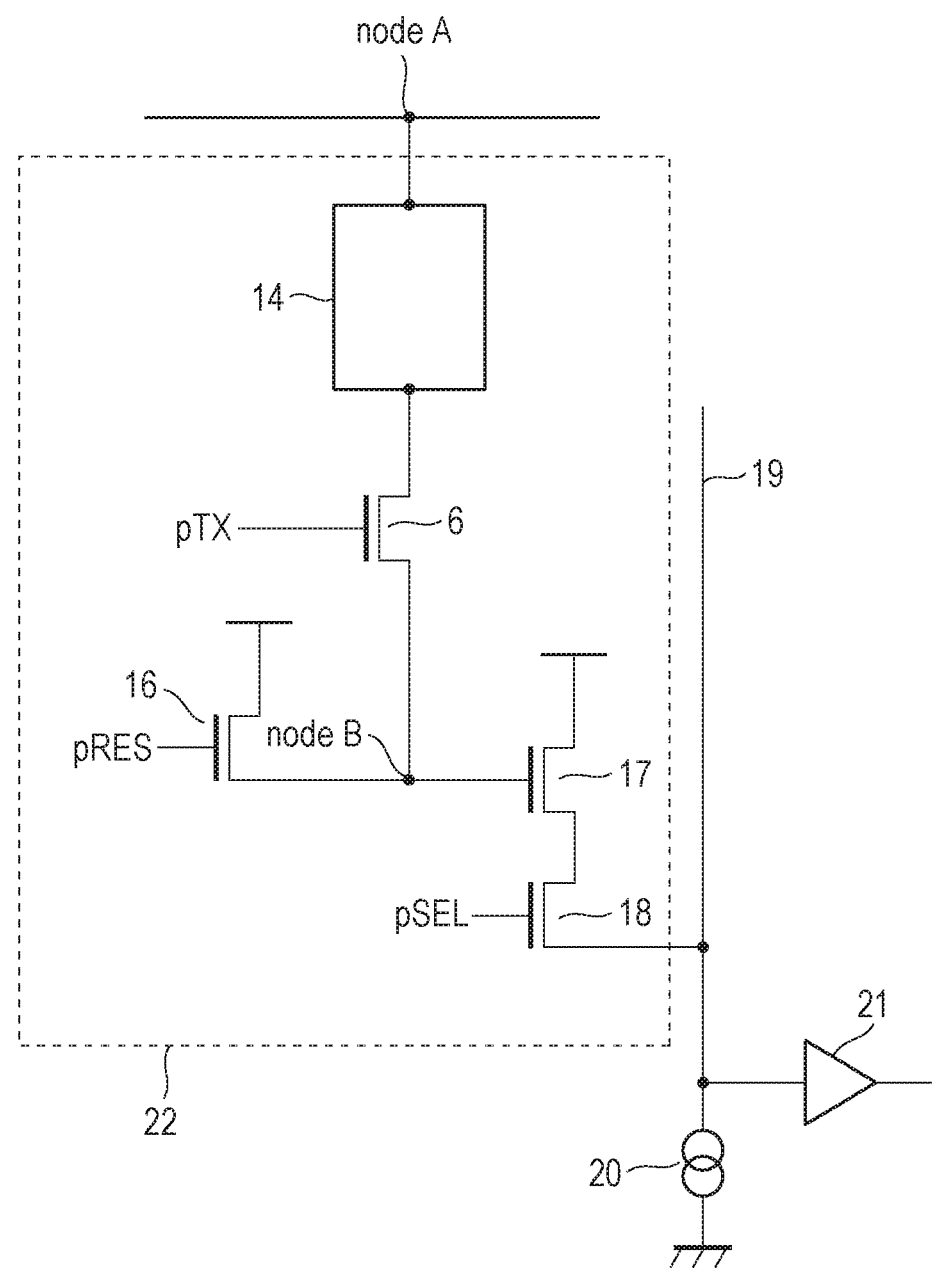
FIG. 2 is a circuit diagram of a pixel including a photoelectric conversion device according to an embodiment of the present disclosure.

FIG. 2 is a circuit diagram of a photoelectric conversion device according to an embodiment of the present disclosure. The photoelectric conversion element 14 of the photoelectric conversion device is connected to a common conductive line at node A. The common conductive line may be grounded.

A pixel 22 may include the photoelectric conversion element 14 and a readout circuit that reads signals generated from the photoelectric conversion portions. The photoelectric conversion device of the present disclosure includes a first readout circuit connected to the first photoelectric conversion portion and a second readout circuit connected to the second photoelectric conversion portion. The first readout circuit is intended to read signals generated from the first photoelectric conversion portion, and the second readout circuit is intended to read signals generated from the second photoelectric conversion portion. Each readout circuit may include a readout transistor electrically connected to the photoelectric conversion element 14, an amplifying transistor 17 having a gate electrode electrically connected to the photoelectric conversion element 14, and a selection transistor 18 that selects a pixel into which information will be read. The readout circuit may include a reset transistor 16 that applies a reset voltage to the photoelectric conversion element 14.

The transfer by the readout transistor 6 may be controlled by signal pTX. The voltage application from the reset transistor 16 may be controlled by signal pRES. The selection transistor is switched between a selecting state and a non-selecting state by signal pSEL.

The readout transistor 6, the amplifying transistor 17, the reset transistor 16 are connected at node B. The readout transistor 6 is not necessarily required, depending on the configuration.

The reset transistor 16 applies a voltage to reset the potential at node B. The voltage is controlled by applying pRES to the gate of the reset transistor 16. The reset transistor 16 is not necessarily required, depending on the configuration.

The amplifying transistor 17 is a transistor to which a current corresponding to the potential at node B is applied. The amplifying transistor 17 is connected to the selection transistor 18 that selects a pixel to which signals should be output. The selection transistor 18 is connected to a current source 20 and a column output circuit 21. The Column output circuit 21 may be connected to a signal processing unit.

The selection transistor 18 is connected to a vertical output signal line 19. The vertical output signal line 19 is connected to the current source 20 and the column output circuit 21.

Figure 3:
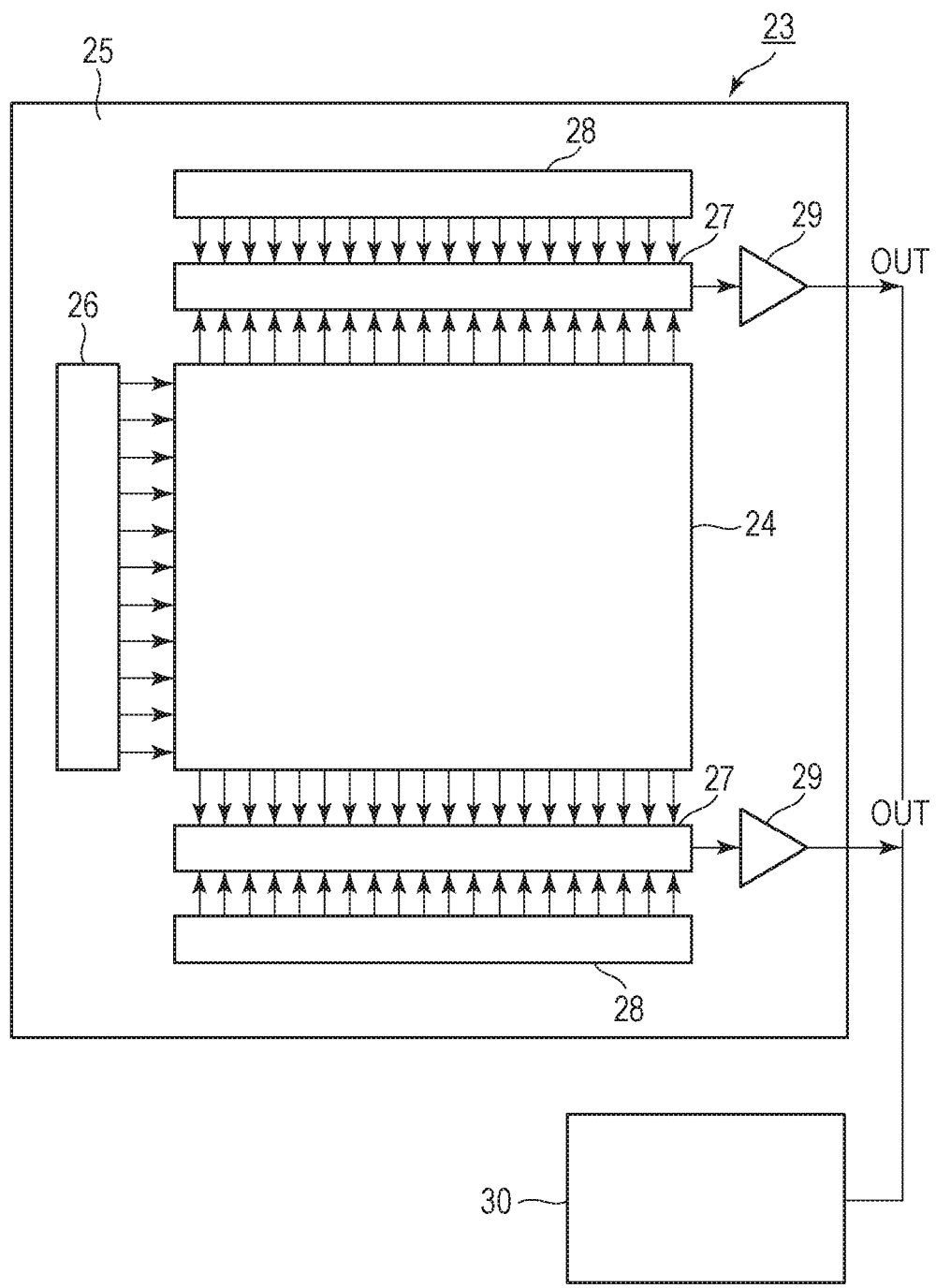
FIG. 3 is a diagram of an imaging element according to an embodiment of the present disclosure.

FIG. 3 is a diagram of an imaging element according to an embodiment of the present disclosure. The imaging element 23 has an imaging region 24 in which a plurality of pixels are two-dimensionally arranged, and a peripheral region 25. The peripheral region 25 is defined by the region other than the imaging region 24. The peripheral region 25 has a vertical scanning circuit 26, readout circuits 27, horizontal scanning circuits 28, and output amplifiers 29. The output amplifiers are connected to a signal processing unit 30. The signal processing unit 30 processes signals according to information read into the readout circuit and may be a CCD circuit or a CMOS circuit.

The readout circuits 27 each include, for example, a column amplifier, a CDS circuit, and an adder, and perform amplification and addition of the signals read from the pixels in a row selected by the vertical scanning circuit 26 through the vertical signal lines. The column amplifier, the CDS circuit, the adder, and the like may be provided for each pixel line or every plural pixel lines. The horizontal scanning circuit 28 generates signals for reading signals from the readout circuit 27 one after another. The output amplifiers 29 amplify the signals in a row selected by the horizontal scanning circuit 28 and output the amplified signals.

The configuration just described is merely one of the exemplary embodiments of the photoelectric conversion device, and other configurations may be provided in other embodiments. The readout circuits 27, the horizontal scanning circuits 28, and the output amplifiers 29 are disposed, one each, at an upper and a lower region with the pixel region 24 therebetween, thus establishing two systems of output paths. In another embodiment, however, three or more systems of output paths may be established. The signals output from the output amplifiers 29 are synthesized into an image signal in the signal processing unit 30.

The peripheral region 25 may have a light-blocking region. The light-blocking region may have an optical black pixel, and the signals generated in the optical black pixel may be used to remove fixed pattern noise.

The imaging device may have an imaging system including a plurality of lenses, and the imaging elements according to the present embodiment. The imaging elements of the imaging device receive light that has passed through the corresponding lenses, thereby producing information to be transferred to the signal processing unit.

The imaging device of the present embodiment may further include a transmitter adapted to transmit data to the outside, or a receiver adapted to receive data from the outside. The imaging device including a receiver or a transmitter may be a network camera disposed at a fixed point.

Figure 4:
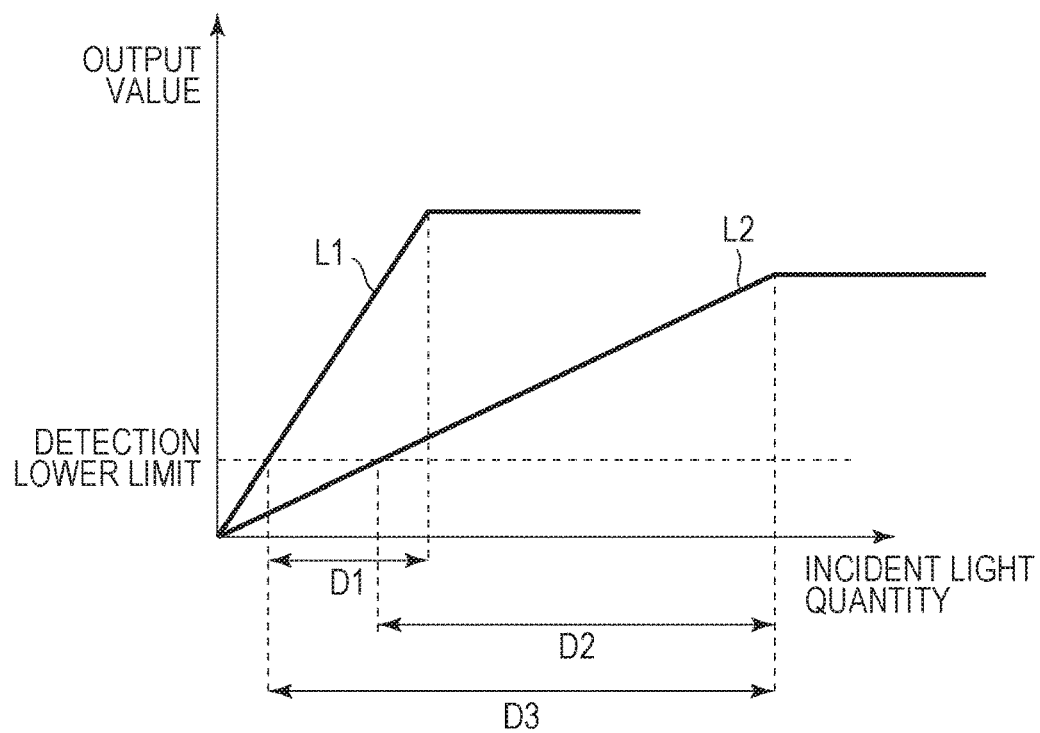
FIG. 4 is a representation illustrating the dynamic range of a photoelectric conversion device according to an embodiment of the present disclosure.

Wide Dynamic Range of the Photoelectric Conversion Device According to the Present Disclosure It will now be described how to expand the dynamic range. FIG. 4 shows the quantity of light incident on the pixel and the quantities of signals in the first photoelectric conversion portion 4 and the second photoelectric conversion portion 5. The quantity of incident light refers to the quantity of light incident on the pixel including the first photoelectric conversion portion 4 and the second photoelectric conversion portion 5, but does not mean the quantity of light that enters the first photoelectric conversion portion 4 or the second photoelectric conversion portion 5.

L1 represents the quantity of the signal in the first photoelectric conversion portion versus the quantity of incident light, and L2 represents the quantity of the signal in the second photoelectric conversion portion versus the quantity of incident light. L1 and L2 each increase linearly in a low incident light quantity and are each saturated at a certain incident light quantity.

When the quantity of a signal is lower than the detection limit and depends on noise, this signal is buried in noise and cannot be used. While the first photoelectric conversion portion 4 directly receives incoming light, the second photoelectric conversion portion 5 receives PL light that is weak light converted from the incoming light. Therefore, the gradient of L2 is smaller than that of L1.

The dynamic ranges of the first and the second photoelectric conversion portion are represented by D1 and D2, respectively. The dynamic range of the photoelectric conversion device can be expanded to D3, for example, by using the signal of the first photoelectric conversion portion when the incident light quantity is small, and by using the signal of the second photoelectric conversion portion when the incident light quantity is large. Hence, the dynamic range of the photoelectric conversion device can be extended by combining D1 and D2.

In general, the photoelectric conversion layer or the like is formed by vacuum deposition, an ink jet method, screen printing, photolithography, or the like. At this time, however, the thickness of the layer varies in a plane of the imaging device, or the thickness varies among imaging devices.

The present inventors have found that photoelectric conversion device of the present embodiment enables errors in signal quantity resulting from errors in thickness to decrease. This will be described below.

According to the Lambert-Beer law, when light passes through a layer having a thickness of d, the proportion ($I_T/I_0$) of the quantity ($I_T$) of the light (transmitted light) that has passed through the thickness d to the quantity ($I_0$) of light incident on the layer is expressed by equation (2), and the proportion ($I_A/I_0$) of the quantity ($I_A$) of light absorbed in the layer to the quantity ($I_0$) of the incident light is expressed by equation (3). $\alpha$ represents the absorption coefficient of the layer.

$$I_T/I_0 = e^{-\alpha d} \quad (2)$$

$$I_A/I_0 = 1 - e^{-\alpha d} \quad (3)$$

Also, when the quantity of light that has passed through a layer having a thickness of x times as large as thickness d is represented as $I_T'$ and the quantity of light absorbed in the layer with a thickness of x times is represented as $I_A'$, proportion ($I_T/I_T'$) of quantity $I_T$ to quantity $I_T'$ is expressed by equation (4) using ($I_T/I_0$), and proportion ($I_A/I_A'$) of quantity $I_A$ to quantity $I_A'$ is expressed by equation (5) using ($I_T/I_0$).

$$I_T/I_T' = \frac{e^{-\alpha d}}{e^{-\alpha dx}} = (I_T/I_0)^{1-x} \quad (4)$$

$$I_A/I_A' = \frac{1-e^{-\alpha d}}{1-e^{-\alpha dx}} = \frac{1-(I_T/I_0)}{1-(I_T/I_0)^x} \quad (5)$$

Figure 5:
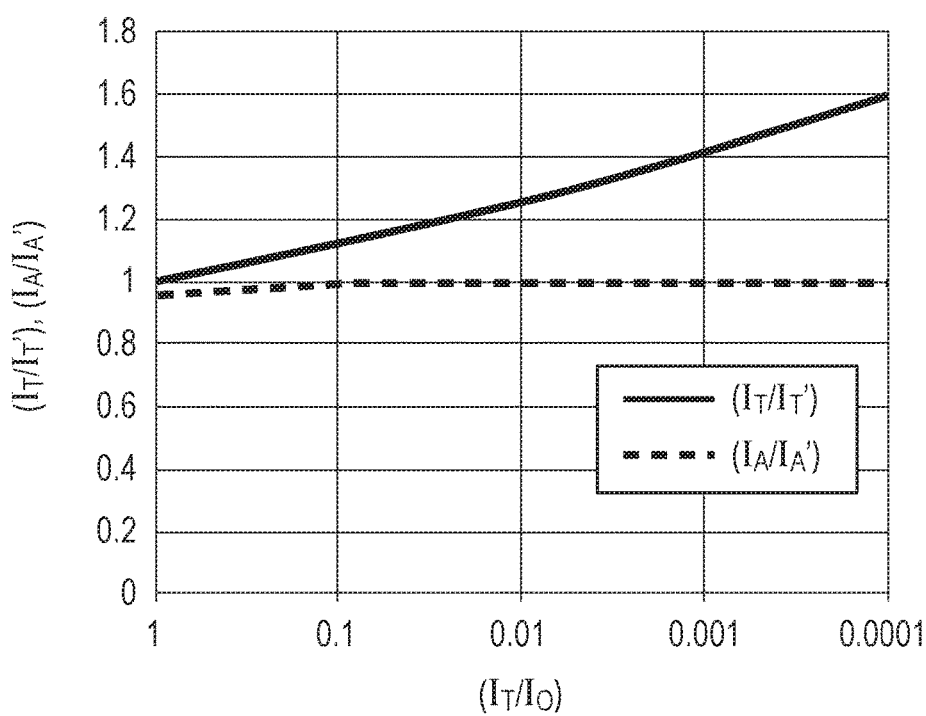
FIG. 5 is a representation of the tendency of errors in absorption and transmission resulting from an error in thickness.

FIG. 5 represents equations (4) and (5) with a thickness dependence at x=1.05. x can be considered to be a coefficient representing the degree of an error in thickness, and the value of $I_T/I_T'$ is an indicator of the degree of an error in quantity of transmitted light when the thickness has an error. If the quantity of transmitted light has no error, $I_T/I_T'$ is 1; as the error in quantity of transmitted light increases, the value of $I_T/I_T'$ deviates from 1. Similarly, the value of $I_A/I_A'$ is an indicator of the degree of an error in quantity of light absorption.

FIG. 5 shows that $I_T/I_T'$ deviates from 1 as $I_T/I_0$ decreases, whereas $I_A/I_A'$ is consistently almost 1.

In a structure in which the first photoelectric conversion portion disposed toward the light-incident side absorbs light and reduces the light and, then, the second photoelectric conversion portion receives transmitted light having an intensity reduced by the absorption, the quantity of light is affected by the thickness, and this is not beneficial. In this structure, the dynamic range expands as the transmittance of the photoelectric conversion portion disposed toward the light-incident side decreases. However, the relationship between $I_T/I_T'$ and $I_T/I_0$ shows that as the light transmittance decreases, the error in quantity of transmitted light resulting from the error in thickness increases.

In the photoelectric conversion device of the present disclosure, the light-emitting member absorbs light and converts the light into PL light, and the PL light is received by the second photoelectric conversion portion. Therefore, the error in PL light quantity resulting from the error in thickness corresponds to the error in absorption. The relationship between $I_A/I_A'$ and $I_T/I_0$ suggests that this structure reduces the error in PL light quantity resulting from the error in thickness.

In the case where a photoelectric conversion layer doubles as the light-emitting layer, the quantity of PL light is represented by the product of the quantity of absorbed light and the photoluminescence quantum yield (hereinafter referred to as PL quantum yield) of the photoelectric conversion layer doubling as the light-emitting layer. The term PL quantum yield refers to the ratio of the number of photons emitted by luminescence to the number of photons absorbed. Since the error in absorbed light resulting from the error in thickness is small, the error in quantity of PL light can be small.

In the case where the light-emitting member is disposed on the lower electrode side of the photoelectric conversion layer in the first photoelectric conversion portion, the light that has passed through the photoelectric conversion layer of the first photoelectric conversion portion enters the light-emitting member. Accordingly, the transmitted light through the photoelectric conversion layer has an error in quantity resulting from the error in thickness. In the present disclosure, however, the degree of decrease in light quantity can be controlled by the PL quantum yield in the light-emitting member, but not by using a member that reduces light quantity by mainly controlling the transmittance of the photoelectric conversion layer. The term PL quantum yield refers to the ratio of the number of photons emitted by luminescence to the number of photons absorbed, as mentioned above. Accordingly, the output error resulting from the error in thickness of the photoelectric conversion layer is reduced by appropriately setting the light absorptance (transmittance) of the photoelectric conversion layer and the PL quantum yield of the light-emitting member, and, thus, a wide dynamic range can be achieved.

Beneficially, the photoelectric conversion sensitivity of the first photoelectric conversion portion is higher than that of the second photoelectric conversion portion. In such a case, the difference in gradient between L1 and L2 in FIG. 4 increases, and the dynamic range further expands, accordingly.

In the photoelectric conversion device of the present embodiment, it is beneficial that the area (area of the light-receiving surface), in plan view, of the light-receiving region of the second photoelectric conversion portion in each pixel be smaller than that of the first photoelectric conversion portion.

In such a case, the difference in gradient between L1 and L2 in FIG. 4 increases, and the dynamic range further expands, accordingly. In one embodiment, the area of the light-receiving surface of the second photoelectric conversion portion 5 is 1/10 or less of the area of the light-receiving surface of the first photoelectric conversion portion 4.

To control the area of the light-receiving surface, the area of the photoelectric conversion portion may be controlled, or the area of the region of the photoelectric conversion portion irradiated with light may be controlled. To control the area of the region of the photoelectric conversion portion that light enters, a light-blocking layer may be formed to shield a portion of the second photoelectric conversion portion from light. In this instance, the light-blocking layer has such a shape that an opening like a pin-hole is formed over the second photoelectric conversion portion.

In the photoelectric conversion device of the present embodiment, the PL quantum yield of the light-emitting member is beneficially as small as 10% or less. In this instance, light quantity is reduced to at least one-tenth, and thus the gradient of L2 in FIG. 4 is reduced. Thus, the dynamic range can be expanded to at least 10 times. Also, the PL quantum yield may be 5% or less and is beneficially 1% or less.

The PL quantum yield of the light-emitting member may be determined by measuring a thin-film sample having the same composition as the light-emitting member, formed on a quartz glass substrate or the like with an absolute PL quantum yield measuring apparatus designed for thin-film measurement. The absolute quantum yield measuring apparatus may be C9920-02 manufactured by Hamamatsu Photonics.

The light-emitting material capable of emitting PL light may be a phosphorescence-emitting material. It is known that thin films made of a phosphorescence-emitting material are excited with high-intensity light and causes triplet-triplet annihilation, and that the quantity of PL light is proportional to the one-half power of the quantity of light incident on the film.

In this instance, the gradient of L2 in FIG. 4 decreases as the quantity of incident light increases, and the dynamic range further expands, accordingly. The phosphoresce-emitting material may be an iridium complex or a platinum complex.

The emission lifetime of the phosphorescence-emitting material in the light-emitting member is beneficially less than 100 μs, more beneficially less than 10 μs. In this instance, the period of time before PL light is emitted after the excitation of the light-emitting member can be shortened, and, thus, the response time of the second photoelectric conversion portion can be shortened. Consequently, an afterimage is not likely to remain in the photoelectric conversion device.

The emission lifetime can be determined by measuring the decay time of the emission intensity of a sample having the same composition as the light-emitting member and formed on a quartz substrate with a streak camera after removal of excitation laser pulses.

The streak camera may be C4334 manufactured by Hamamatsu Photonics. Emission intensity I after t seconds is defined by the following equation (6): $I=I_0 \exp(-t/\tau)$, wherein $I_0$ represents initial emission intensity, and τ represents emission lifetime.

To achieve a still wider dynamic range in the photoelectric conversion device of the present embodiment, the second photoelectric conversion portion receives only the PL light emitted from the light-emitting member. In other words, the second photoelectric conversion portion does not receive the light that has passed through the first photoelectric conversion portion without being converted. In one embodiment, PL light account for a higher proportion of the light that is received by the second photoelectric conversion portion than simply incoming light.

In one embodiment, the light absorptance of the first photoelectric conversion portion may be as high as 90% or more. The light absorptance may be measured by, but not limited to, a known method. More specifically, for example, Shimadzu spectrophotometer SolidSpec-3700 may be used.

The photoelectric conversion device of the present embodiment may be provided with a light-blocking member between each of the photoelectric conversion elements. The light-blocking member prevents PL light from the light-emitting member from diffusing into other photoelectric conversion elements. The presence of the light-blocking members suppresses crosstalk among the pixels.

In the photoelectric conversion device of the present embodiment, it is beneficial that most the transition moments of the light-emitting material be parallel to the light-receiving surface of the second photoelectric conversion portion. By controlling the orientation of the transition moments so that the majority of the transition moments are oriented in a specific direction, the direction of the PL light emission from the light-emitting material can be controlled, and crosstalk among the pixels can be suppressed.

The phrase a majority of transition moments are oriented in a specific direction means that the transition moments are substantially aligned in a specific direction rather than at random. In the case, for example, where the first photoelectric conversion portion including the light-emitting member lies over the second photoelectric conversion portion, it is beneficial that a majority of the transition moments of the light-emitting material in the light-emitting member be parallel to the horizontal direction (in the direction perpendicular to the thickness direction of the semiconductor layer).

The photoelectric conversion device of the present embodiment may include a wavelength limiter and an incoming light-blocking member. The wavelength limiter may be disposed closer than the color filter to the light-incident side and can restrain the light not used for imaging from entering. For example, an IR filter or the like may be used. A protective layer or a microlens may have a function as the wavelength limiter.

The incoming light-blocking member may be disposed between the first photoelectric conversion portion and the second photoelectric conversion portion. The incoming light-blocking member blocks the light that has passed through the first photoelectric conversion portion and transmits PL light emitted from the light-emitting material. Thus, the second photoelectric conversion portion can receive substantially only PL light, and the dynamic range can be expanded.

The incoming light-blocking member may be made of amorphous silicon, a resin containing a dye, or any other material that can absorb light having a desired wavelength, or may be defined by a dielectric multilayer film or any other layer that can reflect a specific wavelength.

Figure 6:
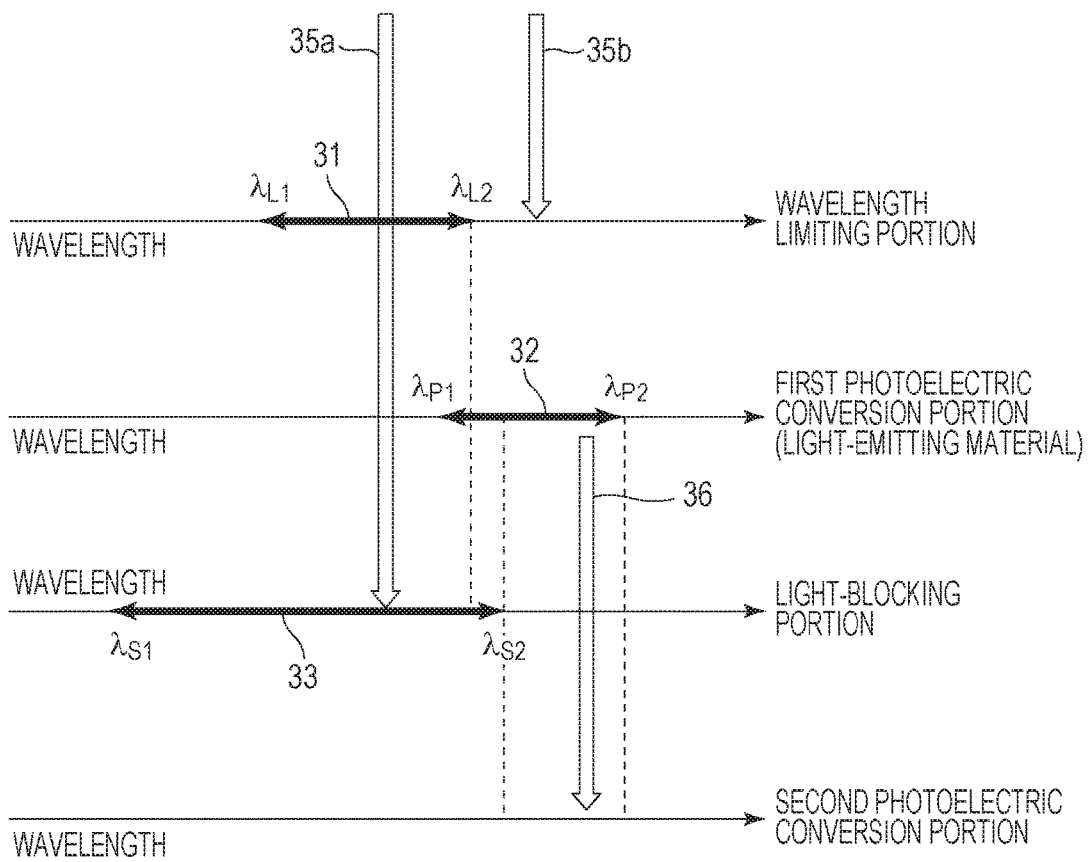
FIG. 6 is a representation of the relationships among the wavelengths of incoming light, photoluminescent light, and light to be blocked by a light-blocking member in another embodiment of the present disclosure.

Referring to FIG. 6, the uppermost line represents the wavelength limiter having a limited wavelength region 31. The limited wavelength region 31 is a range of wavelengths, and the wavelength limiter has a transmittance of 10% or more for light rays having wavelengths in this range. $\lambda_{L1}$ is the minimum wavelength in the limited wavelength region 31, and $\lambda_{L2}$ is the maximum wavelength in the limited wavelength region 31.

The wavelength limiter transmits only light 35a including incoming light rays having wavelengths in the limited wavelength region 31 and does not transmit light 35b outside this region. The transmittance of light may be measured by, but not limited to, a known method. More specifically, for example, Shimadzu spectrophotometer SolidSpec-3700 may be used.

The second line from the top represents the first photoelectric conversion portion having a PL light wavelength region 32. The PL light wavelength region 32 is a range of wavelengths in which the intensity of PL light is 10% or more relative to the highest intensity in the PL spectrum. $\lambda_{P1}$ is the minimum wavelength in the PL light wavelength region 32, and $\lambda_{P2}$ is the maximum wavelength in the PL light wavelength region 32. The first photoelectric conversion portion emits PL light 36.

The third line from the top represents the incoming light-blocking member having a blocked wavelength region 33. The blocked wavelength region 33 is a range of wavelengths, and the incoming light-blocking member has a transmittance of less than 10% for light rays having wavelengths in this range. $\lambda_{S1}$ is the minimum wavelength in the blocked wavelength region 33, and $\lambda_{S2}$ is the maximum wavelength in the blocked light wavelength region 33.

Beneficially, the following relationship (A) holds true:

$$\lambda_{S1} \leq \lambda_{L1} \leq \lambda_{L2} \leq \lambda_{S2} \qquad (A)$$

In this instance, the incoming light-blocking member restrains the light 35a that has passed through the first photoelectric conversion portion from reaching the second photoelectric conversion portion.

More beneficially, the following relationship (B) holds true, and the second photoelectric conversion portion has a photoelectric conversion sensitivity to light between $\lambda_{S2}$ and $\lambda_{P2}$:

$$\lambda_{L2} \leq \lambda_{S2} \leq \lambda_{P2} \qquad (B)$$

Consequently, the incoming light is restrained from reaching the second photoelectric conversion portion, whereas PL light 36 reaches the second photoelectric conversion portion.

Other Components

The photoelectric conversion device of the present embodiment may be provided with a light guide between the first photoelectric conversion portion and the second photoelectric conversion portion. For example, in the photoelectric conversion device shown in FIG. 1, the light guide may be disposed in the intervening insulating layer 11. The side surfaces of the light guide are surrounded by the intervening insulating layer 11.

The light guide has a function to confine entering PL light therein and then transmit the PL light to the second photoelectric conversion portion. The light guide prevents PL light from diffusing to the outside of the second photoelectric conversion portion, thus beneficially increasing the efficiency in use of light. Thus, crosstalk, which results from diffusion of PL light, can be suppressed.

The function of guiding light is established by the light guide and the adjacent layer having a different refractive index from the refractive index of the light guide. The difference between the two refractive indices causes PL light to reflect at the interface, thus guiding the PL light to the second photoelectric conversion portion. By giving the light guide a higher refractive index than the layer adjacent to the light guide, reflection efficiency can be increased. For example, if the intervening insulating layer is made of silicon oxide, the light guide may be made of silicon nitride.

Alternatively, the side surfaces of the light guide may be surrounded by a metal reflector or the like so that light is guided by metal reflection.

It is beneficial that the section of the light guide taken parallel to the substrate be reduced according to how close to the second photoelectric conversion portion the light guide is.

The photoelectric conversion device of the present embodiment may be provided with a light diffusion suppressor between the light-emitting material of each photoelectric conversion element and the first photoelectric conversion portion of the adjacent photoelectric conversion element or the second photoelectric conversion portion of the adjacent photoelectric conversion element. The light diffusion suppressor may be disposed between the first photoelectric conversion portions of any two adjacent photoelectric conversion elements. The light diffusion suppressor absorbs or reflects PL light, thereby preventing the PL light emitted from the light-emitting material from diffusing to other photoelectric conversion elements. The light diffusion suppressors may be disposed any position if it can prevent PL light from diffusing. Beneficially, the light-diffusion suppressor is disposed so as to surround pixels.

The light diffusion suppressor may be made of a reflective material, such as aluminum, silver, indium, or tungsten, or a diffusing material, such as barium sulfate, magnesium oxide, or aluminum oxide. Alternatively, the light diffusion suppressor may be made of a material used in black matrixes or any other material capable of absorbing light rays having wavelengths in the PL light region.

If the light diffusion suppressor is reflective, a high reflectivity may be given by forming the light diffusion suppressor of a material having a lower refractive index than the layer adjacent to the light diffusion suppressor. For example, if the adjacent layer is made of an organic compound, the light diffusion suppressor may be made of silicon oxide.

The light diffusion suppressor may be made of a resin containing a coloring agent capable of absorbing light rays having wavelengths in the PL light region. A dielectric multilayer film or any other material capable of reflecting light rays having wavelengths in the PL light region may be used. However, the light diffusion suppressor has to transmit light rays having wavelengths that the photoelectric conversion device should detect.

Second Embodiment

Figure 7:
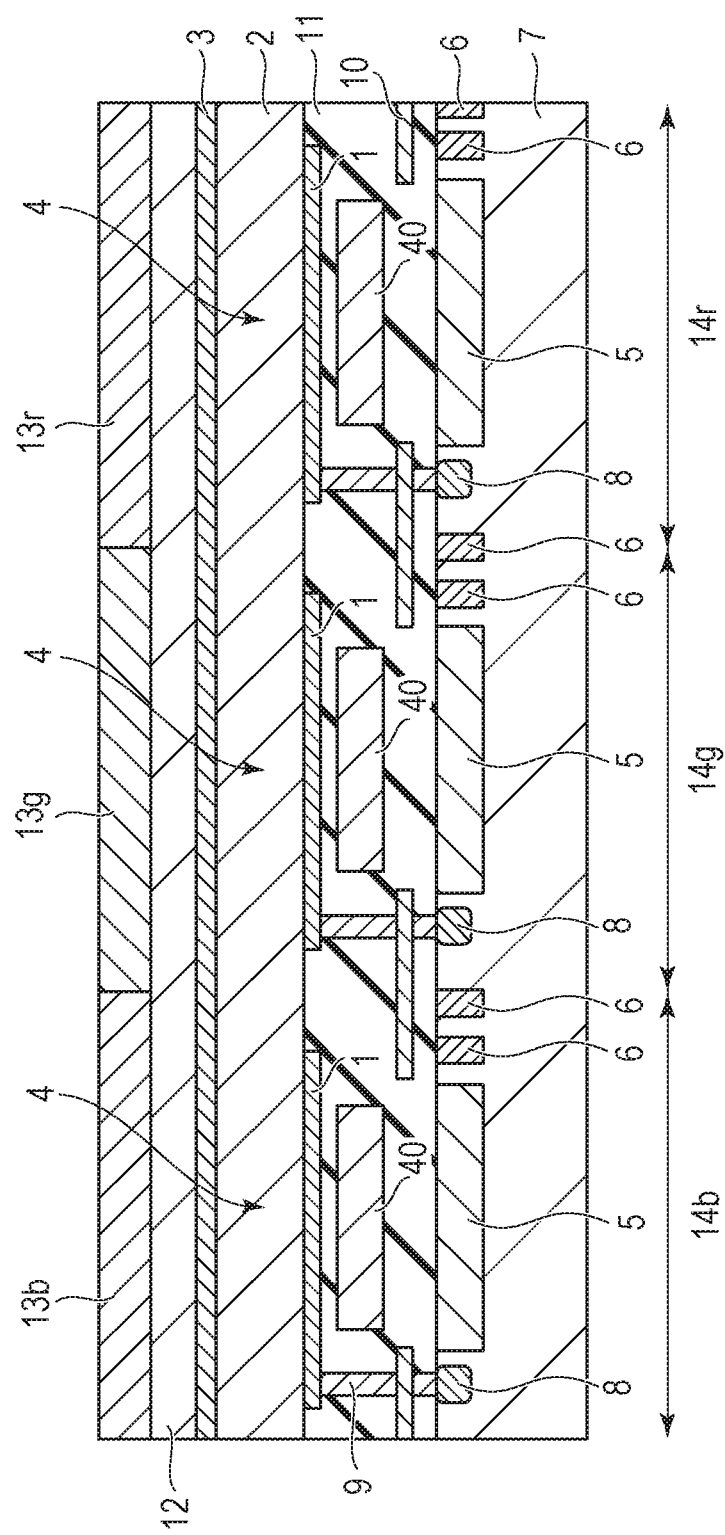
FIG. 7 is a schematic sectional view of a photoelectric conversion device according to a second embodiment.

FIG. 7 is a schematic sectional view of a photoelectric conversion device according to a second embodiment of the present disclosure. In this embodiment, the same parts as in the first embodiment are designated by the same reference numerals, and thus description thereof is omitted. In the present embodiment, light-emitting members 40 are disposed between each first photoelectric conversion portion 4 and the corresponding second photoelectric conversion portion 5. The light-emitting member 40 is a portion containing a light-emitting material. The structure in which the light-emitting members 40 are disposed between each first photoelectric conversion portion 4 and the corresponding second photoelectric conversion portion 5 allows light that has passed through the first photoelectric conversion portion 4 to enter the light-emitting member 40 efficiently, and PL light emitted from the light-emitting member 40 is efficiently received by the second photoelectric conversion portion 5. In addition, since the light-emitting member is not included in either photoelectric conversion portion, charges generated from the photoelectric conversion portion do not quench PL light emitted from the light-emitting member, and thus, the error of the resulting photoelectric conversion device can be minimized.

The light-emitting member 40 may be in contact with the first photoelectric conversion portion 5. In this instance, absorption of light into the intervening insulating layer 11 can be reduced.

Further Embodiment

Figure 8:
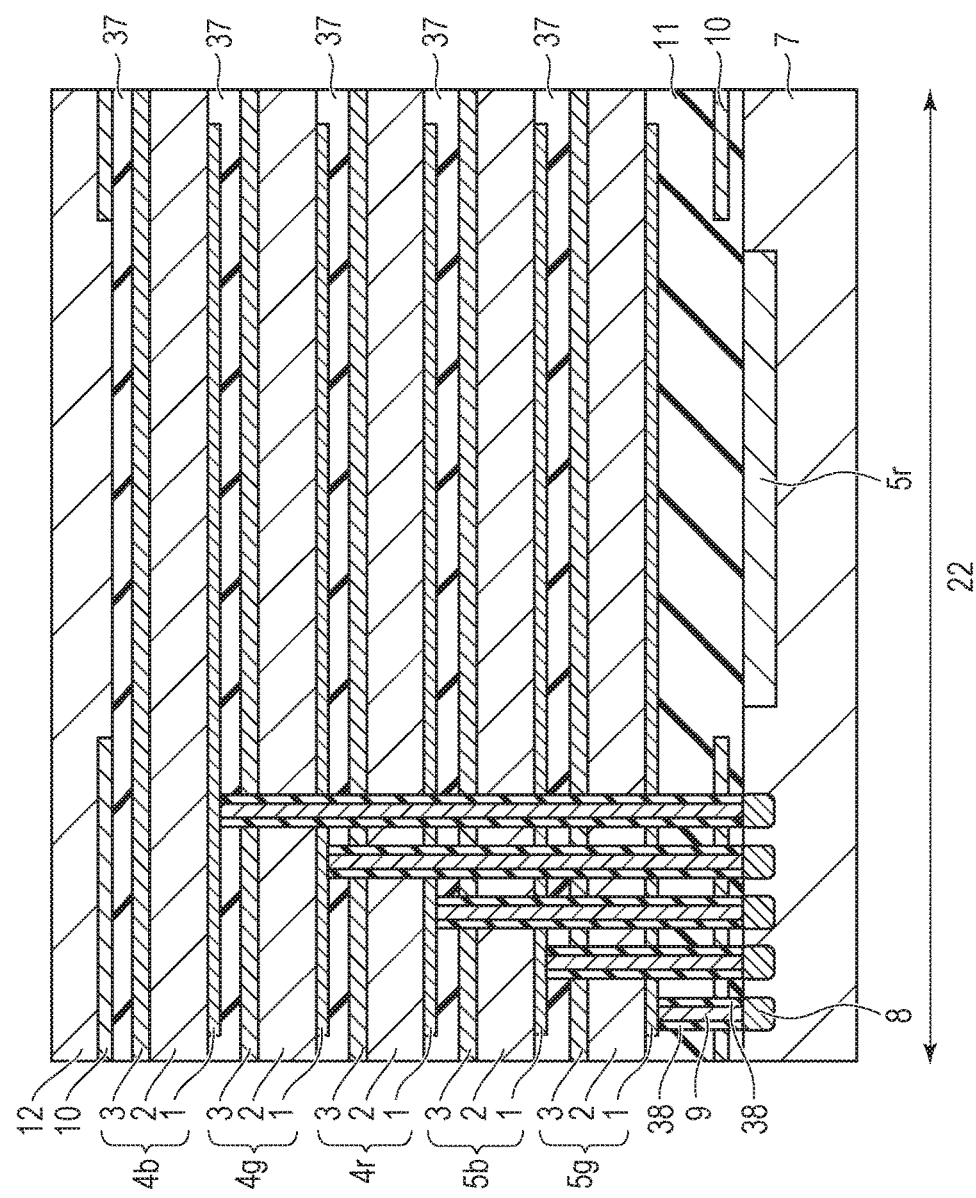
FIG. 8 is a schematic sectional view of a photoelectric conversion device according to another embodiment.

FIG. 8 is a schematic sectional view of a photoelectric conversion device according to a further embodiment of the present disclosure. FIG. 8 shows one of the pixels, including layers of first photoelectric conversion portions 4b, 4g, and 4r used for detecting the three primary colors of light: blue, green, and red, respectively. The photoelectric conversion portions are separated from each other by intermediate layers 37 disposed therebetween.

The first photoelectric conversion portion 4b for blue color detection includes an upper electrode 3, a semiconductor layer 2, and a lower electrode 1. The semiconductor layer 2 includes a photoelectric conversion layer capable of converting blue light into electrical charges and transmitting green and red light.

The first photoelectric conversion portion 4g for green color detection includes an upper electrode 3, a semiconductor layer 2, and a lower electrode 1. The semiconductor layer 2g includes a photoelectric conversion layer capable of converting green light into electrical charges and transmitting at least red light. The first photoelectric conversion portion 4r for red color detection includes an upper electrode 3, a semiconductor layer 2, and a lower electrode 1. The semiconductor layer 2r includes a photoelectric conversion layer capable of converting red light into electrical charges.

The material capable of converting blue light into electrical charges may be a coumarin derivative. The material capable of converting green light into electrical charges may be a quinacridone derivative. The material capable of converting red light into electrical charges may be a phthalocyanine derivative. The materials for photoelectric conversion are not limited to these.

Each first photoelectric conversion portion 4 for color detection includes a light-emitting member. Each light-emitting member is excited by light with the detection color of the corresponding first photoelectric conversion portion and emits PL light. The wavelength region of the PL light is different among the light-emitting members. In the present embodiment, the light-emitting member of the blue color detection first photoelectric conversion portion 4b emits PL light in a wavelength region b. The light-emitting member of the green color detection first photoelectric conversion portion 4g emits PL light in a wavelength region g. The light-emitting member of the red color detection first photoelectric conversion portion 4r emits PL light in a wavelength region r.

A second photoelectric conversion portion 5b is intended for blue color detection and includes a lower electrode 1, an upper electrode 3, and a semiconductor layer 2 between the lower and the upper electrode. This semiconductor layer 2 includes a photoelectric conversion layer having a photoelectric conversion sensitivity to a wavelength in the PL light wavelength region b and transmits light rays having wavelengths in the PL light wavelength region g and the PL light wavelength region r.

Another second photoelectric conversion portion 5g is intended for green color detection and includes a lower electrode 1, an upper electrode 3, and a semiconductor layer 2 between the lower and the upper electrode. This semiconductor layer 2 includes a photoelectric conversion layer having a photoelectric conversion sensitivity to a wavelength in the PL light wavelength region g and transmits at least light rays having wavelengths in the PL light wavelength region r.

Also, a further photoelectric conversion portion 5r, which is intended for red color detection, is an embedded silicon photodiode and has a photoelectric conversion sensitivity to a wavelength in the PL light wavelength region r.

The photoelectric conversion portions 4b, 4g, 4r, 5b, and 5g are disposed over a semiconductor substrate 7, and each of the lower electrodes 1 of the photoelectric conversion portions is connected to the corresponding impurity diffusion region 8 formed in the semiconductor substrate 7 through a plug 9. The plug 9 is covered with an insulating film 38.

The intervening insulating layer 11 and the protective layer 12 each comprise at least one selected from the group consisting of SiO, SiN, SiON or the like. A light-blocking layer 10 comprises tungsten or the like. The light-blocking layer 10 in the intervening insulating layer is in such a shape that an opening is formed over the red color detection second photoelectric conversion portion 5r. Thus, the readout circuit (not shown), the impurity diffusion region 8, and the region where plugs 9 are formed are shielded from light.

The PL light emitted from the blue color detection first photoelectric conversion portion 4b is detected by the blue color detection second photoelectric conversion portion 5b. The PL light emitted from the green color detection first photoelectric conversion portion 4g is detected by the green color detection second photoelectric conversion portion 5g. The PL light emitted from the red color detection first photoelectric conversion portion 4r is detected by the red color detection second photoelectric conversion portion 5r.

The pixel 14 described in the present embodiment has a plurality of sets of the first and the second photoelectric conversion portion 4 and 5. The wavelength of the light emitted from the light-emitting material in each first photoelectric conversion portion corresponds to the wavelength that the corresponding second photoelectric conversion portion absorbs. Thus, the photoelectric conversion device of the present embodiment can detect a plurality of color light rays over a wide dynamic range with a high resolution.

If the first photoelectric conversion portions 4 detect visible light, it is beneficial that the range of wavelengths of PL light emitted from each light-emitting member include the near-infrared region.

Although the first photoelectric conversion portions and the second photoelectric conversion portions are stacked in any order without particular limitation, it is beneficial to stack the second photoelectric conversion portions in decreasing order of detection color wavelength from the substrate side, and the first photoelectric conversion portions closer than the second photoelectric conversion portions to the light-incident side in decreasing order of detection color wavelength.

As described above, the photoelectric conversion devices disclosed herein contain a light-emitting material. In such a device, errors in signal resulting from an error in thickness of the photoelectric conversion portion can be reduced, and the photoelectric conversion device exhibits a wide dynamic range.

The present disclosure provides a photoelectric conversion device containing a light-emitting material, capable of photoelectric conversion in a wide dynamic range.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-140643 filed Jul. 15, 2016, No. 2016-140644 filed Jul. 15, 2016, and No. 2017-110322 filed Jun. 2, 2017, which are hereby incorporated by reference wherein in their entirety.

What is claimed is:

1. A device comprising a plurality of photoelectric conversion elements containing a light-emitting material disposed at light incident side of the photoelectric conversion element, the plurality of photoelectric conversion elements, which convert light having color different from each other, comprises:
   an upper and a lower electrode;
   at least one first photoelectric conversion portion between the upper electrode and the lower electrode, the first photoelectric conversion portion including a photoelectric conversion layer;
   at least one second photoelectric conversion portion;
   a first readout circuit connected to the first photoelectric conversion portion;
   a second readout circuit connected to the second photoelectric conversion portion;
   an incoming light-blocking member between the first photoelectric conversion portion and the second photoelectric conversion portion; and
   a wavelength limiter disposed closer than the first photoelectric conversion portion to the light-incident side, the wavelength limiter limiting the wavelength of light in a range from a minimum wavelength $\lambda_{L1}$ to a maximum wavelength $\lambda_{L2}$,
   wherein the incoming light-blocking member blocks light in a wavelength region from a minimum wavelength $\lambda_{S1}$ to a maximum wavelength $\lambda_{S2}$, and the incoming light-blocking member and the wavelength limiter satisfy the following relationship (A):

$$\lambda_{S1} \leq \lambda_{L1} \leq \lambda_{L2} \leq \lambda_{S2} \quad (A),\text{ and}$$

wherein the second photoelectric conversion portion converts light emitted from the light-emitting material into electrical charges.

2. The device according to claim 1, wherein the light-emitting material is contained in a light-emitting member disposed between the first photoelectric conversion portion and the second photoelectric conversion portion.

3. The device according to claim 1, wherein the light-emitting material is contained in the first photoelectric conversion portion.

4. The device according to claim 1, wherein the photoelectric conversion layer of the first photoelectric conversion portion comprises an organic compound, and the second photoelectric conversion portion comprises an inorganic compound.

5. The device according to claim 2, wherein the first photoelectric conversion portion is disposed closer than the second photoelectric conversion portion to the light incident side.

6. The device according to claim 3, wherein the light-emitting material is present closer than the photoelectric conversion layer to the lower electrode.

7. The device according to claim 1, wherein a majority of the transition moments in the light-emitting material are parallel to a surface of the second photoelectric conversion portion, the surface being to receive light.

8. The device according to claim 1, wherein the first photoelectric conversion portion has a higher photoelectric conversion sensitivity than the second photoelectric conversion portion.

9. The device according to claim 1, wherein the second photoelectric conversion portion has a smaller light-receiving area than the first photoelectric conversion portion has.

10. The device according to claim 1, wherein the light-emitting material emits light including light rays having a wavelength in a near-infrared region.

11. The device according to claim 1,
    wherein the light emitting material emits light in a wavelength region up to a maximum wavelength $\lambda_{P2}$ and satisfying the relationship (B):

$$\lambda_{L2} \leq \lambda_{S2} \leq \lambda_{P2} \quad (B),\text{ and}$$

wherein the second photoelectric conversion portion has a photoelectric conversion sensitivity to light having a wavelength in the range from $\lambda_{S2}$ to $\lambda_{P2}$.

12. The device according to claim 1, further comprising a light guide between the first photoelectric conversion portion and the second photoelectric conversion portion.

13. The device according to claim 1, wherein further comprising a light diffusion suppressor between each of the first photoelectric conversion portions.

14. The device according to claim 1, wherein the first photoelectric conversion portion has a light absorptance of 90% or more.

15. The device according to claim 1, wherein the at least one first photoelectric conversion portion is defined by a plurality of first photoelectric conversion portions, and the at least one second photoelectric conversion portion is defined by a plurality of second photoelectric conversion portions,
    wherein each of the plurality of first photoelectric conversion portions receives light in a different wavelength region from the others, and each of the plurality of second photoelectric conversion portions receives light in a different wavelength region from the others.

16. An imaging element comprising:
    the device as set forth in claim 1; and
    a signal processing circuit connected to the readout circuit of the photoelectric conversion device.

17. An imaging device comprising:
    an imaging system including a plurality of lenses; and
    an imaging element for receiving light that has passed through the imaging system, the imaging element being the imaging element as set forth in claim 16.

18. The device according to claim 1, wherein each of the plurality of photoelectric conversion elements further comprises a color filter.

* * * * *